(12) United States Patent
Rosen et al.

(10) Patent No.: US 11,974,418 B2
(45) Date of Patent: Apr. 30, 2024

(54) LIGHT-SEALING GASKET WITH CROSSBAR FORCE DISTRIBUTION

(71) Applicant: Google LLC, Mountain View, CA (US)

(72) Inventors: David I. Rosen, Mountain View, CA (US); Matthew Douglas Dombach, San Francisco, CA (US); James L Tanner, Glen Ellyn, IL (US); Warren Z. Jones, Glen Ellyn, IL (US); Timothy Patrick Barber, Chicago, IL (US)

(73) Assignee: Google LLC, Mountain View, CA (US)

( * ) Notice: Subject to any disclaimer, the term of this patent is extended or adjusted under 35 U.S.C. 154(b) by 94 days.

(21) Appl. No.: 17/785,320

(22) PCT Filed: Feb. 11, 2021

(86) PCT No.: PCT/US2021/017726
§ 371 (c)(1),
(2) Date: Jun. 14, 2022

(87) PCT Pub. No.: WO2022/173437
PCT Pub. Date: Aug. 18, 2022

(65) Prior Publication Data
US 2023/0354567 A1    Nov. 2, 2023

(51) Int. Cl.
*H05K 9/00* (2006.01)
*H04M 1/02* (2006.01)

(52) U.S. Cl.
CPC .......... *H05K 9/0015* (2013.01); *H04M 1/026* (2013.01); *H05K 9/0024* (2013.01); *H04M 2250/12* (2013.01)

(58) Field of Classification Search
CPC .................................................. H05K 9/0015
See application file for complete search history.

(56) References Cited

U.S. PATENT DOCUMENTS

| | | | |
|---|---|---|---|
| 7,288,727 B1 * | 10/2007 | Garcia ................. | H05K 9/0015 174/387 |
| 9,523,586 B2 | 12/2016 | Torres et al. | |
| 2007/0268679 A1 * | 11/2007 | Kao ..................... | H05K 9/0015 361/800 |

(Continued)

FOREIGN PATENT DOCUMENTS

EP        3544268        9/2019

OTHER PUBLICATIONS

"International Search Report and Written Opinion", PCT Application No. PCT/US2021/017726, dated Oct. 28, 2021, 11 pages.

(Continued)

*Primary Examiner* — Hung V Ngo
(74) *Attorney, Agent, or Firm* — Colby Nipper PLLC

(57) ABSTRACT

This document describes a light-sealing gasket with crossbar force distribution. The gasket can be used in an electronic device with a sensor package that is capable of transmitting and receiving signals and is positioned behind a display of the device. The gasket provides a shield between the receive signals and the transmit signals, prevents signal crosstalk, and protects the delicate panel layer of the display. Use of this gasket in an electronic device allows manufacturers to add more features to the device and enrich the user experience.

20 Claims, 8 Drawing Sheets

(56) References Cited

U.S. PATENT DOCUMENTS

| | | | |
|---|---|---|---|
| 2009/0168314 A1* | 7/2009 | Park | G02F 1/133308 |
| | | | 361/679.02 |
| 2013/0329460 A1* | 12/2013 | Mathew | G06F 1/1637 |
| | | | 362/612 |
| 2013/0342970 A1* | 12/2013 | Franklin | G06F 1/1658 |
| | | | 361/679.01 |
| 2017/0235345 A1* | 8/2017 | Berk | G06F 1/1656 |
| | | | 361/679.55 |
| 2017/0374769 A1* | 12/2017 | Vehkapera | H05K 9/0024 |
| 2018/0373913 A1 | 12/2018 | Panchawagh et al. | |
| 2019/0158713 A1 | 5/2019 | Mcmillan et al. | |
| 2020/0022290 A1* | 1/2020 | Lin | H05K 7/1427 |
| 2021/0019015 A1 | 1/2021 | Yoon et al. | |
| 2021/0120665 A1* | 4/2021 | Lee | H05K 1/181 |
| 2022/0151067 A1* | 5/2022 | Koo | G06F 1/1656 |

OTHER PUBLICATIONS

"International Preliminary Report on Patentability", Application No. PCT/US2021/017726, dated Aug. 15, 2023, 8 pages.

* cited by examiner

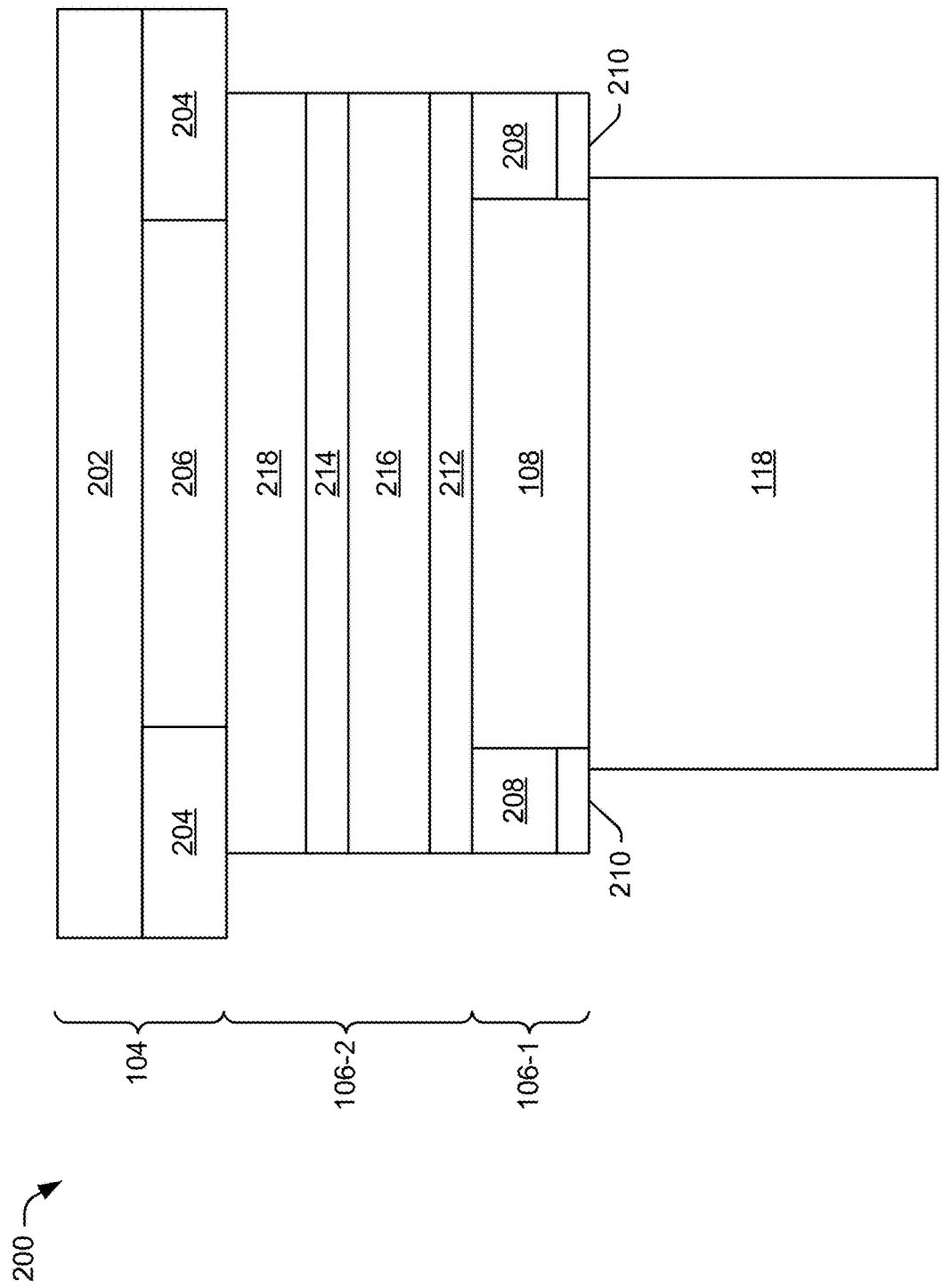

LIGHT-SEALING GASKET WITH CROSSBAR FORCE DISTRIBUTION

RELATED APPLICATION(S)

This application is a national stage entry of International Application No. PCT/US2021/017726, filed Feb. 11, 2021, the disclosure of which is incorporated herein by reference in its entirety.

Background

Manufacturers are continuously upgrading and providing more features for electronic devices, including smartphones and tablets, but the form factors of the devices may not significantly change with each new device iteration. The demand for more sensors, bigger displays, and additional components challenge manufacturers of the electronic devices to fit these features into the device form factor without degrading performance of the device or its features. Avoiding interference between sensors, particularly when adding more sensors to the device, presents a major concern for manufacturers.

SUMMARY

This document describes a light-sealing gasket with crossbar force distribution. The gasket can be used in an electronic device with a sensor package that is capable of transmitting and receiving signals and is positioned behind a display of the device. The gasket provides a shield between receive signals and transmit signals, prevents signal crosstalk, and protects the delicate panel layer of the display. Use of this gasket in an electronic device allows manufacturers to add more features (e.g., by utilizing additional area behind the display for the sensor package) and enrich the user experience.

In some aspects, a gasket for shielding transmit and receive signals of a sensor package positioned under a display module of an electronic device is disclosed. The gasket may include a first section and a second section. The first section may form a frame around an opening with a center axis and have a first surface defining a plane that is substantially orthogonal to the center axis. The frame may be configured to wrap around the sensor package when the sensor package is positioned with the opening. The second section may be assembled to the first surface of the first section. The second section may have a height configured to span a distance between the sensor package and the display module of the electronic device. The second section may be configured to extend across the opening of the first section at a location between a transmit module of the sensor package and a receive module of the sensor package, abut the display module of the electronic device, and shield transmit signals of the transmit module from receive signals of the receive module.

In other aspects, an electronic device is disclosed. The electronic device comprises a display module for displaying media content. The display module may include a copper layer and a panel layer. The copper layer may define a gap that exposes a portion of the panel layer. The electronic device may further include a sensor package positioned under the display module on an opposing side of the copper layer from the panel layer. The sensor package may have a transmit module and a receive module. The electronic device may further include a gasket as described in previous aspects.

This summary is provided to introduce simplified concepts concerning a light-sealing gasket with crossbar force distribution, which is further described below in the Detailed Description. This summary is not intended to identify essential features of the claimed subject matter, nor is it intended for use in determining the scope of the claimed subject matter.

BRIEF DESCRIPTION OF THE DRAWINGS

The details of one or more aspects of a light-sealing gasket with crossbar force distribution are described in this document with reference to the following drawings. The same numbers are used throughout the drawings to reference like features and components.

FIG. 1-2 illustrates a top-down view of the light-sealing gasket with crossbar force distribution in an electronic device introduced in FIG. 1.

FIG. 2 illustrates a stacked-layer view of the light-sealing gasket with crossbar force distribution.

FIG. 4-1 illustrates an example implementation of the light-sealing gasket with crossbar force distribution.

FIG. 4-2 illustrates another example implementation of the light-sealing gasket with crossbar force distribution and a frame around a volume located in front of a transmit module of a sensor package.

FIG. 4-3 illustrates another example implementation of the light-sealing gasket with crossbar force distribution and a frame around a volume located in front of a receive module of the sensor package.

FIG. 4-4 illustrates another example implementation of the light-sealing gasket with crossbar force distribution and frames around the volumes located in front of the transmit module and the receive module of the sensor package.

DETAILED DESCRIPTION

Overview

This document describes a light-sealing gasket with crossbar force distribution that enables manufacturers to locate a sensor package beneath a display module of an electronic device. The gasket frames the sensor package, which includes a transmit module and a receive module. The architecture of the gasket is such that it shields signals between the sensor modules and avoids damage to the display module. Typically, the display module (e.g., for displaying media content) is composed of several layers, including a glass layer, a panel layer, and a copper layer. A portion of the copper layer is removed, enabling signals to pass through the display and not reflect off the copper. However, the panel layer is extremely delicate, and removing the copper layer leaves the panel vulnerable to damage caused by loads applied to it. The gasket spans across the removed portion in the copper layer, applying a load to the copper layer on either side of the removed portion without applying a load to the panel layer. By applying a load to the copper layer, the gasket seals the volume through which the transmit signals travel and the volume through which the receive signals travel from one another, reducing interference between the two modules. Being able to position sensors beneath the display of an electronic device frees area elsewhere within the form factor of the device and ultimately enables more features to be included on the device.

These are a few examples of how the described gasket may be used to shield sensor signals and provide force distribution. Other examples and implementations are described herein. This document now turns to an example system. In the example system, the gasket is employed on a sensor package with a transmit module and a receiver module, but the described gasket may be used on any sensor package installed on an electronic device requiring signals to be shielded.

Example System

Figure 1:
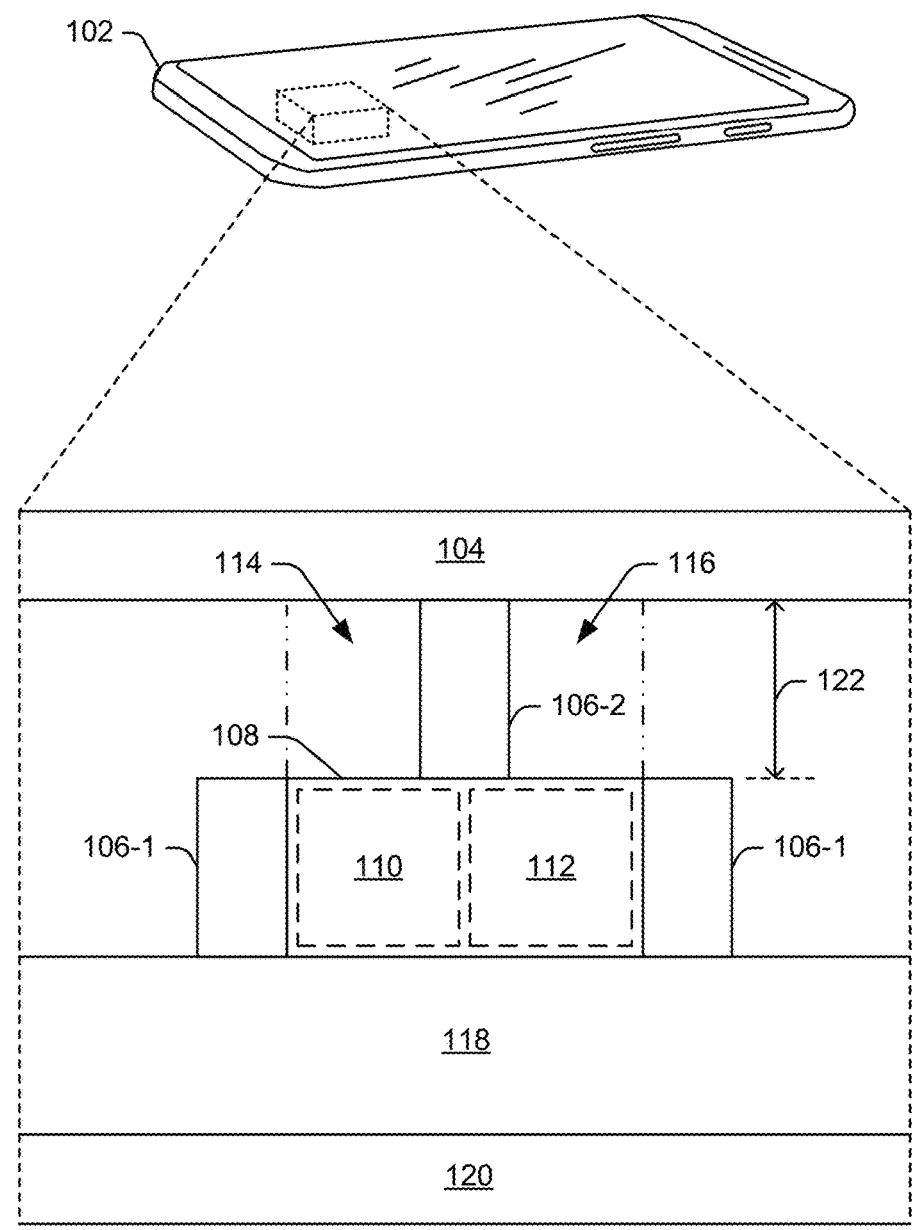
FIG. 1-1 illustrates an example environment of a light-sealing gasket with crossbar force distribution in an electronic device and a cross-sectional view of an example implementation.

FIG. 1-1 illustrates an example environment 100 of a light-sealing gasket with crossbar force distribution in an electronic device 102 and a cross-sectional view of an example implementation. Although illustrated as a handheld device (e.g., mobile phone), the electronic device 102 can represent other types of electronic devices, including tablets, laptops, game consoles, cameras, or any device with a display module. The cross-sectional view includes a display module 104, a gasket 106, and a sensor package 108 having a transmit module 110 and a receive module 112. Some example sensor packages are proximity sensors, ambient light sensors (ALS), or any sensors with multiple signal modules. The sensor package 108 may also represent two individual sensors placed in close proximity to one another. Two volumes (e.g., air gaps) 114 and 116 separate the sensor package 108 and the display module 104. The cross-sectional view also includes an interposer 118 and a back cover 120. The gasket 106 includes a first section 106-1 and a second section 106-2. The first section 106-1 of the gasket 106 surrounds the sensor package 108. The second section 106-2 of the gasket 106 is assembled to the first section 106-1. The second section 106-2 has a height that is configured to span a distance (e.g., the distance 122) between the sensor package 108 and the display module 104. The second section 106-2 spans across the sensor package 108, separating a volume into two volumes (e.g., the volume 114 and the volume 116) that is between the display module 104 and each of the transmit module 110 and the receive module 112. The volume 114 is located in front of the transmit module 110, and the volume 116 is located in front of the receive module 112.

Many sensor packages (e.g., sensor package 108) were previously restricted to areas within the form factor of an electronic device (e.g., electronic device 102) that provided direct access to the outer casing or the bezel of a screen not used for media display. This restriction limits the space within the electronic device where sensors can be located and, consequently, the number of sensors a manufacturer can install on the electronic device. However, many electronic devices have a display module (e.g., display module 104), which utilizes a large area of the electronic device, particularly for a bezel-less or bezel-free display module. Placing sensor packages behind the display module 104, as illustrated in FIG. 1, may provide additional locations for sensors, which increases the capabilities of the electronic device and, consequently, enhances the experience for a user. However, reflectivity of the display module 104 significantly interferes with conventional techniques attempting to position sensor packages behind the display module. The techniques described herein, however, provide a solution to reducing the reflectivity of the display module and avoiding application of a load on the delicate panel layer of the display module.

Figures 1, 2:
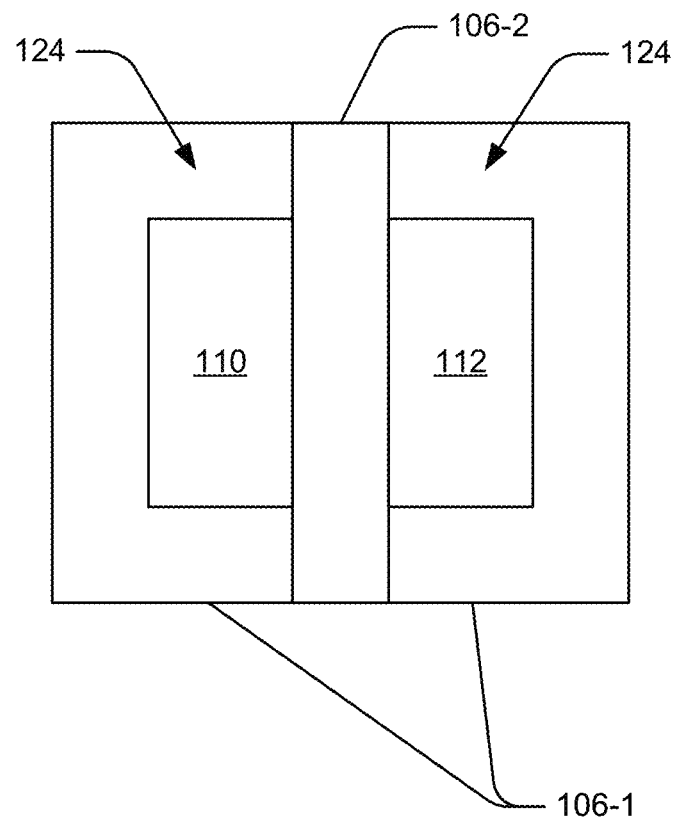

FIG. 1-2 illustrates a top-down view of the light-sealing gasket with crossbar force distribution. The first section 106-1 has a first surface 124. The second section 106-2 is assembled to the first surface 124 of the first section 106-1 and spans the sensor package 108. As mentioned in relation to FIG. 1, the second section 106-2 splits the volume between the sensor package and the display module 104 into two volumes, where the volume 114 is located on the transmit module 110 side of the second section 106-2 and the volume 116 is located on the receive module 112 side of the second section 106-2. The second section 106-2 shields signals transmitted by the transmit module 110 from signals received by the receive module 112, reducing crosstalk between the two sensor modules.

FIG. 2 illustrates a stacked-layer view 200 of the light-sealing gasket 106 with crossbar force distribution. The display module 104 includes at least a panel layer 202 and a copper layer 204. The panel layer 202 may be stacked on an opposing side of the copper layer 204 from the second section 106-2. In some aspects, the display module 104 may include additional layers (e.g., glass layer, embossed layer), which, for simplicity of discussion, are not represented in this illustration. As transmit and receive signals may not propagate through copper, the copper layer 204 has a portion removed to define a gap (e.g., air gap 206) in the copper layer 204, which exposes a portion of the panel layer 202. The panel layer 202 may be delicate and receive cosmetic defects (e.g., dimples, abrasions, cracks) with less than 10 grams of force applied to it. The copper layer 204 is capable of withstanding much larger forces being applied.

The gasket 106 can be assembled in multiple stacked layers. For example, the first section 106-1 may include a structural layer 208 and an adhesive layer 210. The adhesive layer affixes the gasket 106 to the interposer layer 118. The structural layer 208 frames the sensor package 108, providing a base for the second section 106-2. In aspects, the structural layer 208 may be composed of hard rubber, stiff foam, epoxy resins, plastic (e.g., polyvinyl chloride (PVC), polyethylene (PE), polyethylene terephthalate (PET), polypropylene (PP)), or any other material having structural properties that enable the structural layer 208 to provide structural support to the gasket 106 under a load. One example material used to compose the structural layer may have a compression force deflection of 259 to 279 kPa, though other materials having other ranges of compression force deflection may also be used, such as a material having a compression force deflection of 150 to 300 kPa or another with 280 to 450 kPa, to name just three examples.

The second section 106-2 may include adhesive layers 212 and 214, a compressible layer 216, and a rigid layer 218, and have a height configured to span the distance 122 between the sensor package 108 and the display module 104. The rigid layer 218 (e.g., composed of a metal material) may be configured to abut the copper layer 204 of the display module 104 but does not intrude into the air gap 206. By contacting the copper layer 204 and not the panel layer 202, the rigid layer 218 applies no force to the panel layer 202, avoiding potential damage to the panel layer 202. The rigid layer 218 may be bonded to the compressible layer 216 by the adhesive layer 214. The rigid layer 218, compressible layer 216, and the adhesive layers 212 and 214 may be composed of a signal-blocking material, which shield transmit signals of the transmit module 110 and receive signals of the receive module 112 from one another.

The rigid layer 218 may be composed of a metal material (e.g., stainless steel, aluminum) or other material that is reflective. To reduce reflectivity of the transmit signals and receive signals from the reflective material, the rigid layer 218 may receive further processing. In some aspects, the reflective material may be coated with a non-reflective material. In other aspects, the metal material may be painted a non-reflective color. Additionally or alternatively, the surface of the reflective material may be physically altered (e.g., scored, coarsened) to reduce reflections.

The compressible layer 216 maintains a load on the rigid layer 218 and ensures the rigid layer 218 maintains contact with the copper layer 204 of the display module 104. By maintaining contact with the copper layer 204 and spanning the air gap 206, no load is applied to the panel layer 202. This protects the panel layer 202 from defects and damage. Likewise, the air gap 206 is minimized, further shielding the signals. The compressible layer 216 may be adhered to the first section 106-1 (e.g., the structural layer 208 of the first section 106-1) by the adhesive layer 212.

The compressible layer 216 may be composed of any suitable material, including an elastomeric material. Some example materials may include a spongy foam, natural or synthetic soft rubber, and silicone-based materials. One example material used to compose the compressible layer may have a compression force deflection of 4.0 to 5.0 kPa, though other materials having other ranges of compression force deflection may also be used, such as a material having a compression force deflection of 3.0 to 4.4 kPa or another with 4.3 to 6 kPa, to name just three examples.

Figure 3:
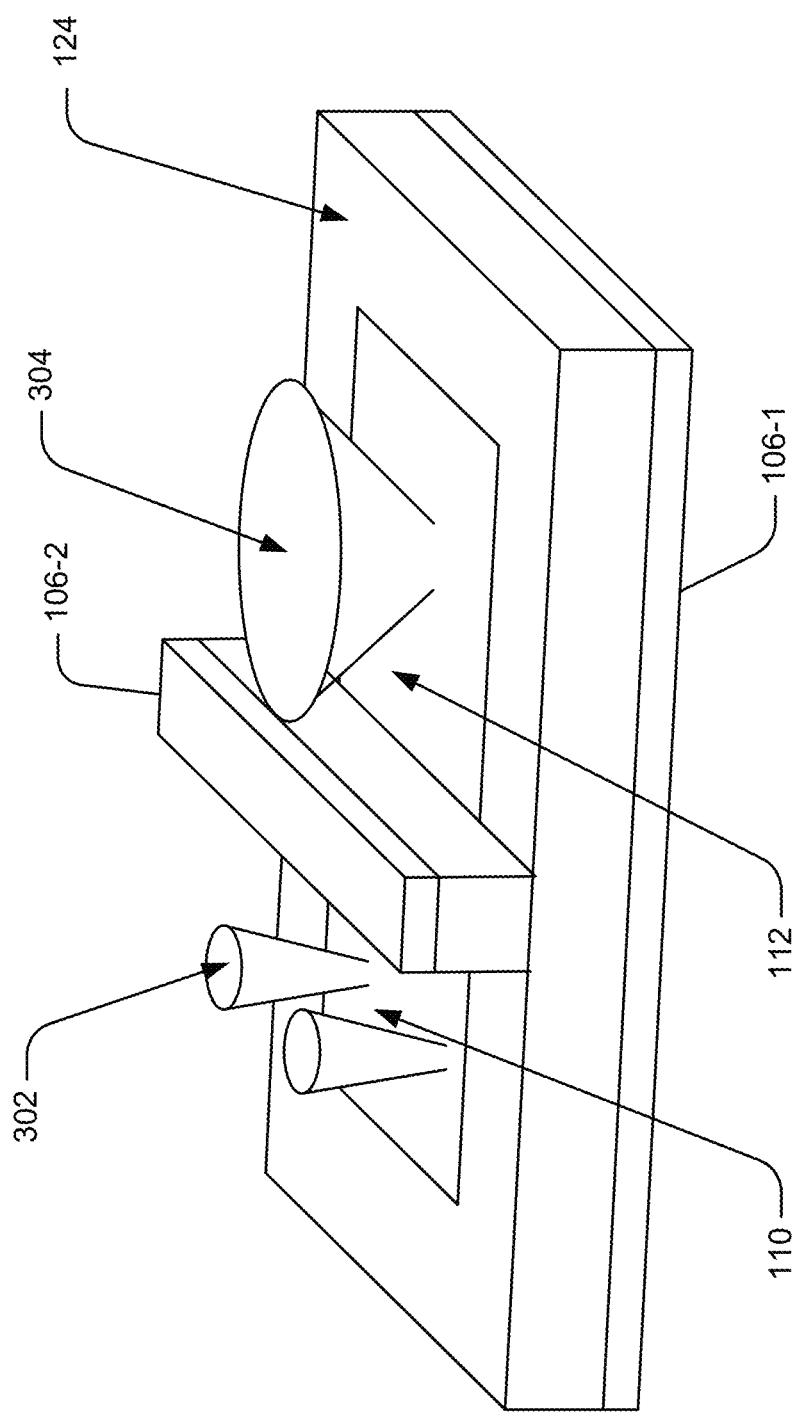
FIG. 3 illustrates the light-sealing gasket with crossbar force distribution shielding transmit signals and receive signals from one another.

FIG. 3 illustrates the light-sealing gasket 106 with crossbar force distribution shielding transmit signals 302 and receive signals 304 from one another. A display module (e.g., the display module 104), not shown in FIG. 3, may be positioned substantially parallel to the first surface 124 of the first section 106-1 and abutted to the second section 106-2. The second section 106-2 separates a volume (e.g., the volume 114 from FIG. 1-1) through which the transmit signals 302 propagate from a volume (e.g., the volume 116 from FIG. 1-1) through which the receive signals 304 propagate. In this manner, the transmit signals 302 and the receive signals 304 may not interfere with one another.

Figures 1, 4:
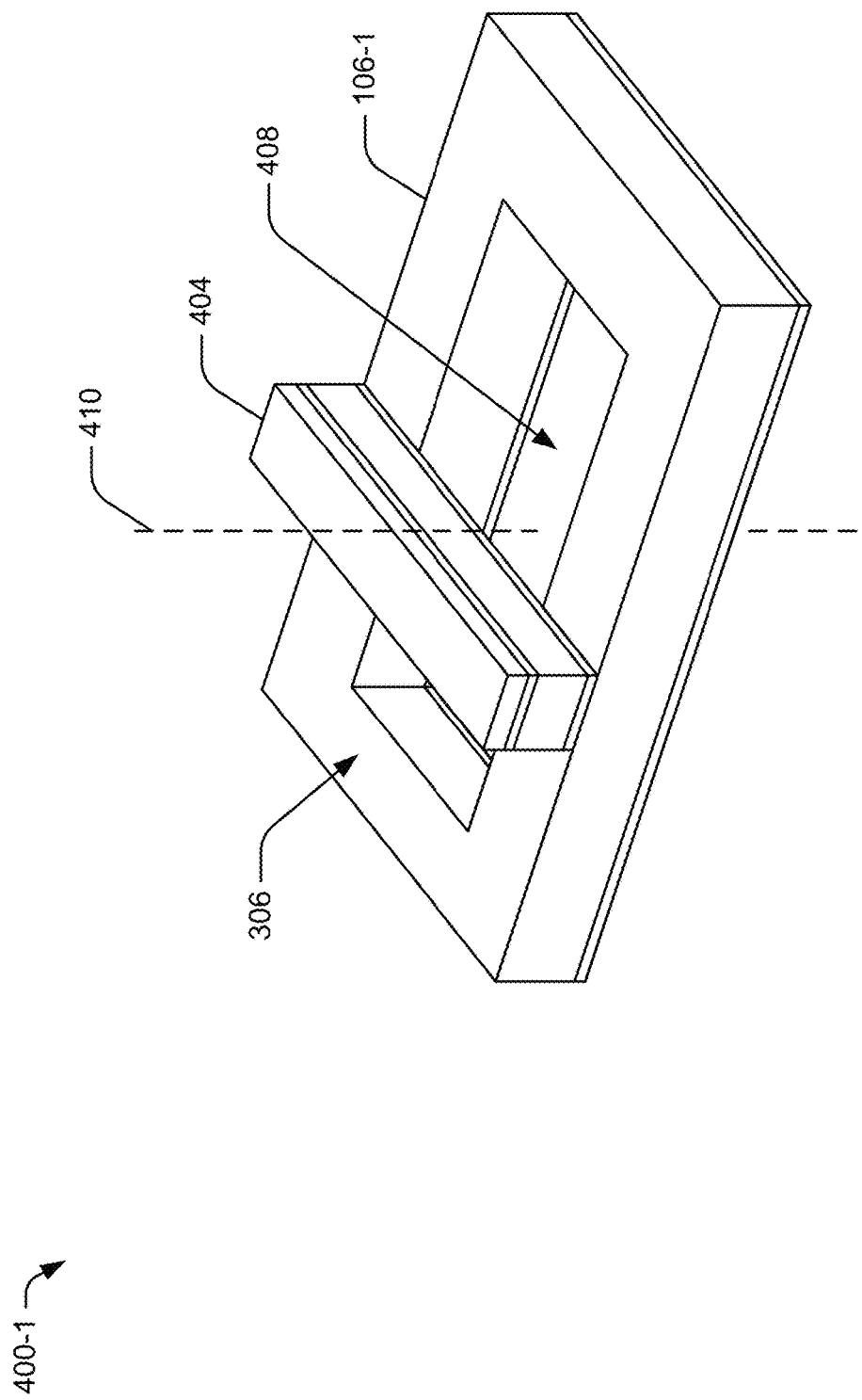
Figures 2, 4:
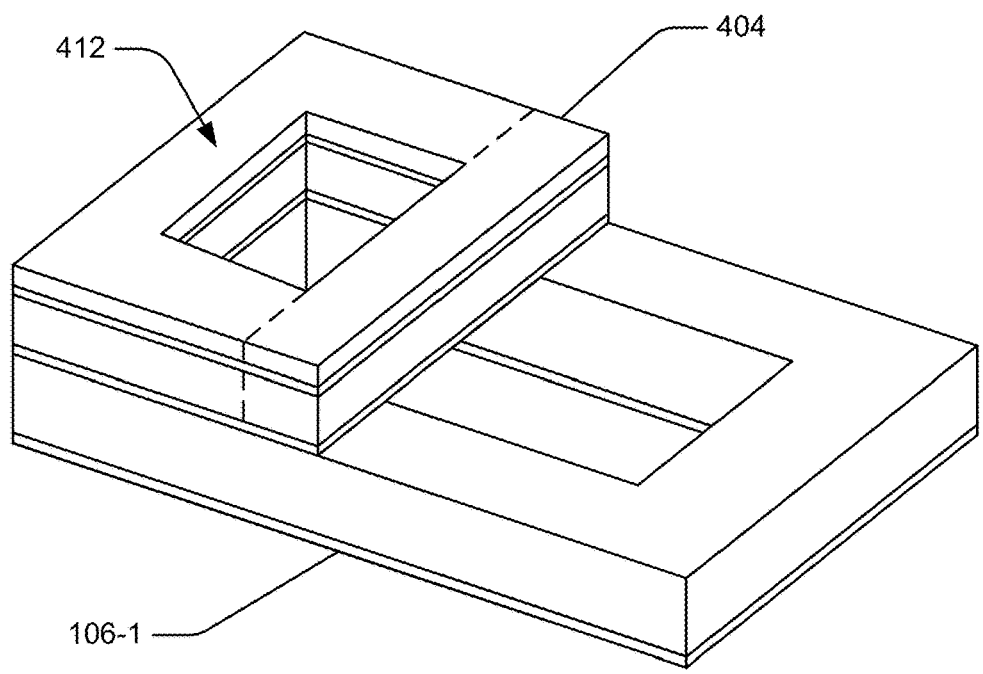
Figures 3, 4:
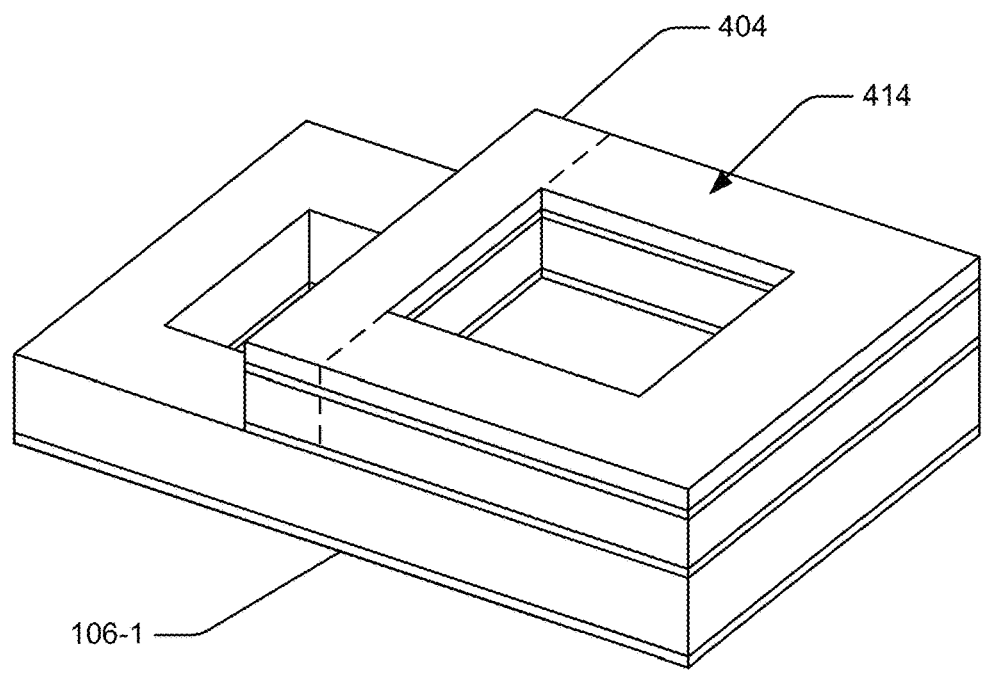
Figure 4:
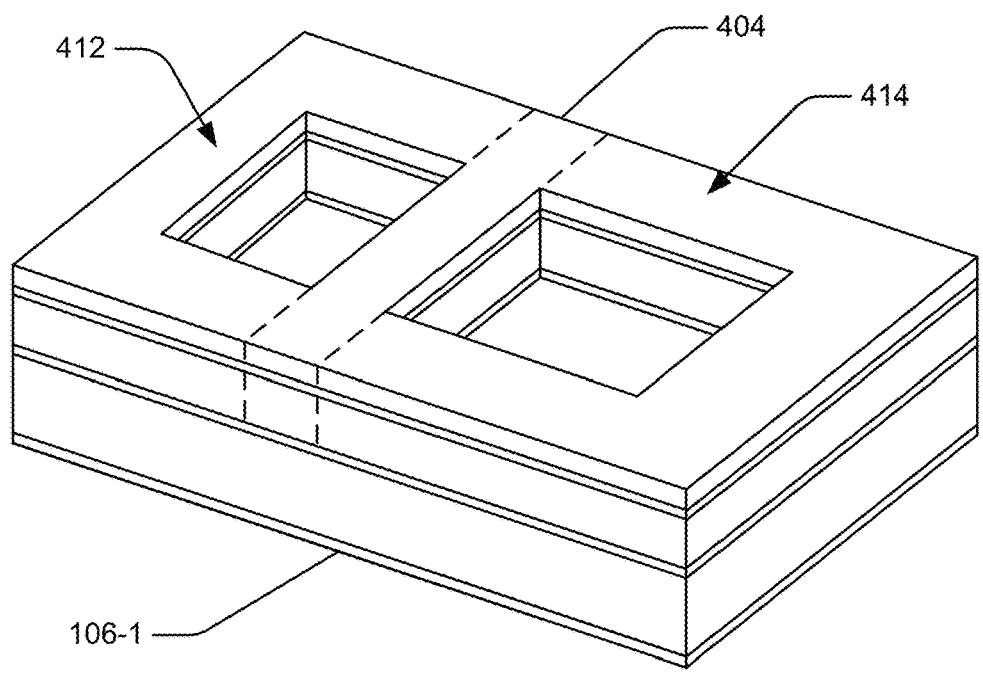

FIG. 4-1 illustrates an example implementation 400-1 of the light-sealing gasket 106 with crossbar force distribution. In implementation 400-1, the gasket 106 includes the first section 106-1 and a second section 404 (e.g., the second section 120-2). The second section 404 is represented as a beam (e.g., crossbar) assembled to the first surface 124 of the first section 106-1 and spanning across an opening (e.g., opening 408 having a center axis 410) defined by the first section 106-1. The first section 106-1 may define the opening 408 as any suitable two-dimensional shape in its top-down view, including a rectangular shape, a square shape, an elliptical shape, a hexagonal shape, and so forth. The shape of the opening 408 may be defined to substantially frame or border the sides of the sensor package 108 (shown in FIG. 1) that are substantially orthogonal to a front of the sensor package 108 (the front being the side of the sensor package 108 where the transmit signals 302 are output and the receive signals 304 are input). Accordingly, the shape of the opening 408 defined by the first section 106-1 of the gasket 106 may substantially match the shape of the sensor package 108, which may be any suitable shape in its top-down view. The second section 404 divides a volume into two volumes (e.g., the volumes 114 and 116, which are proximate to the transmit module 110 and the receive module 112, respectively, as illustrated in FIG. 1).

FIG. 4-2 illustrates another example implementation 400-2 of the light-sealing gasket 106 with crossbar force distribution and a frame around the volume 114 located in front of the transmit module 110 of the sensor package 108. The gasket 106 has the first section 106-1 and a second section 404 (e.g., the second section 106-2). The second section 404 includes a frame 412 and encloses a volume (e.g., the volume 114 from FIG. 1-1 in front of the transmit module 110). The frame 412 can shield other components of an electronic device (e.g., the electronic device 102) from transmit signals (e.g., the transmit signals 302). The frame 412 may also provide additional stability to the second section 404.

FIG. 4-3 illustrates another example implementation 400-3 of a light-sealing gasket 106 with crossbar force distribution and a frame around the volume 116 located in front of the receive module 112 of the sensor package 108. The gasket 106 has the first section 106-1 and the second section 404 (e.g., the second section 106-2). The second section 404 includes a frame 414 and encloses a volume (e.g., the volume 116 from FIG. 1-1). The frame 414 shields the receive module 112 from any spurious signals that may be emitted by other components of an electronic device (e.g., the electronic device 102). Likewise, the frame 414 may provide additional stability to the second section 404.

FIG. 4-4 illustrates another example implementation 400-4 of a light-sealing gasket 106 with crossbar force distribution and frames around the volumes located in front of the transmit module 110 and the receive module 112 of the sensor package 108. The gasket 106 has the first section 106-1 and a second section 404 (e.g., the second section 106-2). The second section 404 includes the frame 412 and the frame 414. Implementing both of the frames 412 and 414 may shield the transmit signals 302 and the receive signals 304 (shown in FIG. 3) from one another and from other components of the electronic device 102 (shown in FIG. 1). Additionally, the frames 412 and 414 may provide structural support around a complete perimeter of the second section 404.

Some examples are described below:

Example 1: A gasket for shielding transmit and receive signals of a sensor package positioned under a display module of an electronic device, the gasket comprises a first section forming a frame around an opening with a center axis, the frame configured to wrap around the sensor package when the sensor package is positioned within the opening, the first section having a first surface defining a plane that is substantially orthogonal to the center axis. The gasket further comprises a second section assembled to the first surface of the first section, the second section having a height configured to span a distance between the sensor package and the display module of the electronic device. The second section is configured to extend across the opening of the first section at a location between a transmit module of the sensor package and a receive module of the sensor package. The second section is further configured to abut the display module of the electronic device. The second section is further configured to shield transmit signals of the transmit module from receive signals of the receive module.

Example 2: The gasket as recited in example 1, wherein the second section forms a beam across the opening and includes a compressible layer, a rigid layer, and an adhesive layer bonding the compressible layer to the rigid layer.

Example 3: The gasket as recited in example 2, wherein the compressible layer is positioned between the rigid layer and the top surface of the first section.

Example 4: The gasket as recited in any of the previous examples, wherein the second section is configured to span a gap in a copper layer of the display module. The second section is further configured to apply a load to the copper layer without applying a load through the gap to a panel layer of the display module that is stacked on an opposing side of the copper layer from the second section.

Example 5: The gasket as recited in examples 2 to 4, wherein the rigid layer is configured to abut the copper layer of the display module on opposing sides of the gap.

Example 6: The gasket as recited in examples 2 to 5, wherein the compressible layer maintains a load on the rigid layer to cause the rigid layer to maintain contact with the copper layer of the display module.

Example 7: The gasket as recited in any of the previous examples, wherein the second section is assembled to the first surface of the first section via an adhesive layer.

Example 8: The gasket as recited in any of the previous examples, wherein the first section includes a structural layer to provide alignment support for the sensor package.

Example 9: The gasket as recited in any of the previous examples, wherein the rigid layer comprises a metal material.

Example 10: The gasket as recited in any of the previous examples, wherein the rigid layer is painted black to reduce reflectivity of the transmit signals and the receive signals.

Example 11: The gasket as recited in any of the previous examples, wherein the second section forms a frame around a volume between the transmit module and the display module.

Example 12: The gasket as recited in any of the previous examples, wherein the second section forms a frame around a volume between the receive module and the display module.

Example 13: The gasket as recited in examples 1 to 10, wherein the second section is a crossbeam.

Example 14: The gasket as recited in examples 2 to 13, wherein the rigid layer and the compressible layer are composed of signal-blocking materials.

Example 15: An electronic device comprises a display module for displaying media content, the display module including a copper layer and a panel layer, the copper layer defining a gap that exposes a portion of the panel layer. The electronic device further comprises a sensor package positioned under the display module on an opposing side of the copper layer from the panel layer, the sensor package having a transmit module and a receive module. The electronic device further comprises a gasket as recited in any of the previous examples.

CONCLUSION

Although aspects of the light-sealing gasket with crossbar force distribution have been described in language specific to features and/or methods, the subject of the appended claims is not necessarily limited to the specific features or methods described. Rather, the specific features and methods are disclosed as example implementations of the light-sealing gasket with crossbar force distribution. Accordingly, other equivalent features and methods are intended to be within the scope of the appended claims. Further, various different aspects are described, and it is to be appreciated that each described aspect can be implemented independently or in connection with one or more other described aspects.

What is claimed is:

1. A gasket comprising:
a first section forming a frame around an aperture with a center axis, the first section having a first surface defining a plane that is substantially orthogonal to the center axis, the first section having a second surface opposite and parallel to the first surface, the aperture extending from the first surface to the second surface, the frame configured to enframe a sensor package when the sensor package is positioned within the aperture; and
a second section disposed on the first surface of the first section, the second section having a height configured to span a distance between the sensor package and a display module of an electronic device, the second section configured to:
extend across the aperture of the first section at a location between a transmit module of the sensor package and a receive module of the sensor package;
abut the display module of the electronic device; and
shield transmit signals of the transmit module from receive signals of the receive module.

2. The gasket of claim 1, wherein the second section forms a beam across the aperture and includes:
a compressible layer;
a rigid layer; and
an adhesive layer bonding the compressible layer to the rigid layer.

3. The gasket of claim 2, wherein the compressible layer is positioned between the rigid layer and the first surface of the first section.

4. The gasket of claim 2, wherein the rigid layer comprises a metal material.

5. The gasket of claim 2, wherein the rigid layer is coated to reduce reflectivity of the transmit signals and the receive signals.

6. The gasket of claim 2, wherein the rigid layer and the compressible layer are composed of signal-blocking materials.

7. The gasket of claim 2, wherein the second section is configured to:
span a gap in a copper layer of the display module; and
apply a load to the copper layer without applying a load through the gap to a panel layer of the display module that is stacked on an opposing side of the copper layer from the second section.

8. The gasket of claim 7, wherein the rigid layer is configured to abut the copper layer of the display module on opposing sides of the gap.

9. The gasket of claim 7, wherein the compressible layer maintains a load on the rigid layer to cause the rigid layer to maintain contact with the copper layer of the display module.

10. The gasket of claim 1, wherein the second section is assembled to the first surface of the first section via an adhesive layer.

11. The gasket of claim 1, wherein the first section includes a structural layer to provide alignment support for the sensor package.

12. The gasket of claim 1, wherein the second section forms a frame around a volume between the transmit module and the display module.

13. The gasket of claim 1, wherein the second section forms a frame around a volume between the receive module and the display module.

14. The gasket of claim 1, wherein the second section is a crossbeam.

15. An electronic device comprising:
a display module for displaying media content, the display module including a copper layer and a panel layer, the copper layer defining a gap that exposes a portion of the panel layer;
a sensor package positioned under the display module on an opposing side of the copper layer from the panel layer, the sensor package having a transmit module and a receive module; and
a gasket comprising:
- a first section forming a frame around an aperture with a center axis, the first section having a first surface defining a plane that is substantially orthogonal to the center axis, the first section having a second surface opposite and parallel to the first surface, the aperture extending from the first surface to the second surface, the frame configured to enframe a sensor package when the sensor package is positioned within the aperture; and
- a second section disposed on the first surface of the first section, the second section having a height configured to span a distance between the sensor package and the display module of an electronic device, the second section configured to:
  - extend across the section at a location between the transmit module of the sensor package and the receive module of the sensor package;
  - abut the display module of the electronic device; and
  - shield transmit signals of the transmit module from receive signals of the receive module.

16. The electronic device of claim 15, wherein the second section forms a beam across the aperture and includes:
a compressible layer;
a rigid layer; and
an adhesive layer bonding the compressible layer to the rigid layer.

17. The electronic device of claim 16, wherein the rigid layer is configured to abut the copper layer of the display module on opposing sides of the gap.

18. The electronic device of claim 16, wherein the rigid layer and the compressible layer are composed of signal-blocking materials.

19. The electronic device of claim 16, wherein the compressible layer maintains a load on the rigid layer to cause the rigid layer to maintain contact with the copper layer of the display module.

20. The electronic device of claim 15, wherein the second section is configured to:
span a gap in a copper layer of the display module; and
apply a load to the copper layer without applying a load through the gap to a panel layer of the display module that is stacked on an opposing side of the copper layer from the second section.

* * * * *